US007186482B2

(12) United States Patent
Kitson et al.

(10) Patent No.: US 7,186,482 B2
(45) Date of Patent: *Mar. 6, 2007

(54) MULTILAYER IMAGEABLE ELEMENTS

(75) Inventors: Anthony P. Kitson, Evans, CO (US); Kevin B. Ray, Fort Collins, CO (US); Socrates P. Pappas, Midland, TX (US); Celin Savariar-Hauck, Badenhausen (DE)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/144,315

(22) Filed: Jun. 3, 2005

(65) Prior Publication Data

US 2005/0287448 A1 Dec. 29, 2005

Related U.S. Application Data

(60) Provisional application No. 60/577,313, filed on Jun. 4, 2004.

(51) Int. Cl.
*G03F 7/039* (2006.01)
*G03F 7/11* (2006.01)
*G03F 7/14* (2006.01)
*G03F 7/30* (2006.01)

(52) U.S. Cl. ........................... 430/15; 430/17; 430/18; 430/271.1; 430/272.1; 430/302; 430/964

(58) Field of Classification Search ............. 430/271.1, 430/272.1, 302, 964, 15, 17, 18
See application file for complete search history.

(56) References Cited

U.S. PATENT DOCUMENTS 6,294,311 B1 9/2001 Shimazu et al.
6,352,811 B1 3/2002 Patel et al.
6,352,812 B1 3/2002 Shimazu et al.
6,358,669 B1 3/2002 Savariar-Hauck et al.
6,528,228 B2 3/2003 Hauck et al.
6,555,291 B1 4/2003 Hauck
6,593,055 B2 7/2003 Shimazu et al.
6,858,359 B2 2/2005 Kitson et al.
6,893,783 B2 * 5/2005 Kitson et al. ................. 430/15
7,049,045 B2 * 5/2006 Kitson et al. ............ 430/270.1
7,060,415 B2 * 6/2006 Kitson et al. ............ 430/271.1
2005/0037292 A1 * 2/2005 Kitson et al. ............... 430/348
2005/0227163 A1 * 10/2005 Ray et al. .................... 430/199
2005/0244749 A1 * 11/2005 Kitson et al. ............ 430/270.1

FOREIGN PATENT DOCUMENTS

EP 897765 2/1999
EP 909657 6/2003
WO 2003083577 10/2003

* cited by examiner

*Primary Examiner*—Richard L. Schilling
(74) *Attorney, Agent, or Firm*—J. Lanny Tucker

(57) ABSTRACT

Multilayer, positive working, thermally imageable, bakeable imageable elements have a substrate, an underlayer, and a top layer. The underlayer comprises a polymeric material that comprises, in polymerized form from about 5 mol % to about 30 mol % of recurring units derived from an ethylenically unsaturated polymerizable monomer having a carboxy group; from about 20 mol % to about 75 mol % of recurring units derived from N-phenylmaleimide, N-cyclohexylmaleimide, N-benzylmaleimide, or a mixture thereof; and from about 3 mol % to about 50 mol % of recurring units derived from a compound represented by the formula:

$$CH_2{=}C(R_2){-}C(O){-}NH{-}CH_2{-}OR_1,$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is hydrogen or methyl. Other materials, such as a resin or resins having activated methylol and/or activated alkylated methylol groups, such as a resole resin, may be present in the underlayer. The elements can be used to produce bakeable lithographic printing plates that are resistant to press chemistries.

13 Claims, No Drawings

MULTILAYER IMAGEABLE ELEMENTS

CROSS REFERENCE TO RELATED APPLICATIONS

Reference is made to and priority claimed from U.S. Provisional Application Ser. No. 60/577,313 filed Jun. 4 2004, entitled MULTILAYER IMAGEABLE ELEMENTS.

FIELD OF THE INVENTION

The invention relates to lithographic printing. In particular, this invention relates to multi-layer, positive-working, thermally imageable elements that are useful in forming lithographic printing plates.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the hydrophilic surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. If the imaged regions are removed, the precursor is positive-working. Conversely, if the unimaged regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask, which has clear and opaque regions. Imaging takes place in the regions under the clear regions of the mask but does not occur in the regions under the opaque regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging, which obviates the need for imaging through a mask, is becoming increasingly important in the printing industry. Imageable elements for the preparation of lithographic printing plates have been developed for use with infrared lasers. Thermally imageable, multi-layer elements are disclosed, for example, in U.S. Pat. No. 6,294,311 (Shimazu et al.); U.S. Pat. No. 6,352,812 (Shimazu et al.); U.S. Pat. No. 6,593,055 (Shimazu et al.); U.S. Pat. No. 6,352,811 (Patel et al.); U.S. Pat. No. 6,358,669 (Savariar-Hauck et al.); and U.S. Pat. No. 6,528,228 (Savariar-Hauck et al.); and U.S. Ser. No. 10/264,814, filed Oct. 4, 2002, the disclosures of which are all incorporated herein by reference.

Despite the progress in thermally imageable elements, there is a desire for positive working, thermally imageable elements that are both bakeable and resistant to press chemistries, such as inks, fountain solution, and the solvents used in washes, such as UV washes. Bakeability is highly desirable because baking increases the press run length.

SUMMARY OF THE INVENTION

The invention is a positive-working, thermally imageable element that is resistant to press chemistry and can be baked to increase press run length. The imageable element comprises:

a substrate;

an underlayer over the substrate; and a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the underlayer is removable by the alkaline developer, and the underlayer comprises a polymeric material that comprises, in polymerized form:

from about 5 mol % to about 30 mol % of recurring units derived from ethylenically unsaturated polymerizable monomers having a carboxy group, from about 20 mol % to about 75 mol % of recurring units derived from N-phenylmaleimide, N-cyclohexylmaleimide, N-benzylmaleimide, or a mixture thereof, from about 3 mol % to about 50 mol % of recurring units derived from a compound (a), represented by the formula:

$$CH_2{=}C(R_2){-}C(O){-}NH{-}CH_2{-}OR_1,$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is H or methyl, and optionally, from about 5 mol % to about 50 mol % of recurring units derived from methacrylamide.

The underlayer may additionally comprise a resin having activated methylol or activated alkylated methylol groups, preferably a resole resin.

In addition, the underlayer may further comprise (1) a first added copolymer or (2) the first added copolymer, and a second added copolymer. The first added copolymer comprises recurring units derived from N-phenylmaleimide; methacrylamide; acrylonitrile; and compound (b), represented by the formula:

$$CH_2{=}C(R_4){-}CO_2{-}CH_2CH_2{-}NH{-}CO{-}NH\text{-p-}C_6H_4{-}R_3,$$

in which $R_3$ is OH, COOH, or $SO_2NH2$; and $R_4$ is hydrogen or methyl;

and, optionally, from about 1 to about 30 wt %, preferably, when present, from about 3 to about 20 wt % of compound (c), represented by the formula:

$$CH_2{=}C(R_6){-}CO{-}NH\text{-p-}C_6H_4{-}R_5$$

in which $R_5$ is OH, COOH, or $SO_2NH_2$; and $R_6$ is hydrogen or methyl.

The second added copolymer comprises recurring units derived from N-phenylmaleimide, methacrylamide, and (meth)acrylic acid (that is acrylic acid or methacrylic acid).

In another aspect, the invention is a method for forming an image comprising the steps of:

A) thermally imaging the multi-layer imageable element of this invention and forming an imaged imageable element comprising imaged and complementary unimaged regions, and B) developing the imaged imageable element with the alkaline developer and removing the imaged regions without substantially affecting the unimaged regions. This method is particularly useful for preparing lithographic printing plates.

In yet another aspect, the invention is an image formed by the noted method.

The imageable elements are positive working thermally imageable multi-layer elements that are resistant to the press chemistries used in lithographic printing, especially in printing processes using ultraviolet-curing inks, where rinsing agents with a high content of esters, ethers or ketones are used. In addition, they can be baked to increase press run length.

DETAILED DESCRIPTION OF THE INVENTION

Unless the context indicates otherwise, in the specification and claims, the terms binder, resole resin, surfactant, dissolution inhibitor, novolac resin, resin having activated methylol or activated alkylated methylol groups, photothermal conversion material, polymeric material, first added copolymer, second added copolymer, coating solvent, compound (a), compound (b), compound (c), and similar terms also include mixtures of such materials. Unless otherwise specified, all percentages are percentages by weight. Thermal imaging refers to imaging with a hot body, such as a thermal head, or with infrared radiation.

The invention is an imageable element useful as a precursor for a lithographic printing plate. The imageable element comprises a substrate with a hydrophilic surface, an underlayer, and a top layer. A photothermal conversion material is present, either in the underlayer and/or in a separate absorber layer.

Substrate

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent layers. Examples of subbing layer materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a cylinder in a printing press, typically from about 100 μm to about 600 μm. Typically, the substrate comprises an interlayer between the aluminum support and the underlayer. The interlayer may be formed by treatment of the aluminum support with, for example, silicate, dextrine, hexafluorosilicic acid, phosphate/fluoride, polyvinyl phosphonic acid (PVPA), a vinyl phosphonic acid copolymer, or a water-soluble diazo resin.

The backside of the support (i.e., the side opposite the underlayer and top layer) may be coated with an antistatic agent and/or a slipping layer or matte layer to improve handling and "feel" of the imageable element.

Underlayer

The underlayer comprises a polymeric material that, after baking, surprisingly provides resistance to solvents and common printing room chemicals, such as fountain solution, inks, plate cleaning agents, rejuvenators, and rubber blanket washing agents, as well as to alcohol substitutes, which are used in fountain solutions. The underlayer also is resistant to rinsing agents with a high content of esters, ethers, and ketones, which are used with ultraviolet curable inks.

The underlayer is between the hydrophilic surface of the substrate and the top layer. After imaging, it is removed by the developer in the imaged regions to reveal the underlying hydrophilic surface of the substrate. The underlayer comprises a polymeric material that is preferably soluble in the developer to prevent sludging of the developer. In addition, the polymeric material is preferably insoluble in the solvent used to coat the top layer so that the top layer can be coated over the underlayer without dissolving the underlayer. Other ingredients, such as resins that have activated methylol and/or activated alkylated methylol groups, added copolymers, photothermal conversion materials, and surfactants, may also be present in the underlayer.

The polymeric material in the underlayer comprises, in polymerized form, from about 5 mol % to about 30 mol %, preferably from about 10 mol % to about 30 mol % of recurring units derived from an ethylenically unsaturated polymerizable monomer having a carboxy group (such as acrylic acid, methacrylic acid, itaconic acid, and other similar monomers known in the art; but preferably acrylic acid and methacrylic acid are preferred); from about 20 mol % to about 75 mol %, preferably from about 35 mol % to about 60 mol % of recurring units derived from N-phenylmaleimide; N-cyclohexylmaleimide, or a mixture thereof, preferably recurring units derived from N-phenylmaleimide; optionally, from about 5 mol % to about 50 mol %, and preferably when present from about 15 mol % to about 40 mol % of recurring units derived from methacrylamide; and from about 3 mol % to about 50 mol %, preferably from about 10 mol % to about 40 mol % of one or more recurring units derived from monomer compounds (a) of the structure:

$$CH_2{=}C(R_2)—C(O)—NH—CH_2—OR_1;$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is hydrogen or methyl. Methods of preparation of certain of these polymeric materials are disclosed in U.S. Pat. No. 6,475,692 (Jarek), the disclosure of which is incorporated herein by reference.

$R_1$ is $C_1$ to $C_{12}$ alkyl, preferably $C_1$ to $C_4$ alkyl, phenyl, $C_1$ to $C_{12}$ substituted phenyl, $C_1$ to $C_{12}$ aralkyl, or $Si(CH_3)_3$. Typical $C_1$ to $C_{12}$ alkyl groups are 2-methylbutyl, 3-methylbutyl, pentyl, hexyl, heptyl, octyl, nonyl, decyl, undecyl, dodecyl, 4-methylpentyl, 3-methylpentyl, 2-methylpentyl, 2-methylhexyl, 2-ethylpentyl, 5-methylhexyl, 2,2,4-trimethylpentyl, cyclopentyl, cyclohexyl, and alkyl groups of one to four carbon atoms, such as methyl, ethyl, iso-propyl, n-propyl, cyclopropyl, cyclobutyl, i-butyl, iso-butyl, t-butyl, and n-butyl. Typical $C_1$ to $C_{12}$ substituted phenyl groups are p-methylphenyl, m-methylphenyl, o-methylphenyl, p-methoxyphenyl, m-methoxyphenyl, o-methoxyphenyl, p-ethoxyphenyl, p-ethylphenyl, p-1-propylphenyl, p-chlorophenyl, p-bromophenyl, p-cyanophenyl, m-cyanophenyl, p-fluorophenyl, p-nitrophenyl, p-thiomethoxyphenyl, p-(N,N-dimethylamino)phenyl, pentafluorophenyl, pentachlorophenyl, p-trifluoromethylphenyl, 3,5-dichlorophenyl, 3,5-dimethylphenyl, 3,5-diethylphenyl, and 2,4,6-trimethylphenyl. Typical $C_1$ to $C_{12}$ aralkyl groups are benzyl, 1-phenylethyl, 2-phenylethyl, 1-phenylpropyl, and 3-phenylpropyl.

Preferably, $R_1$ is an alkyl group of one to four carbon atoms, phenyl, benzyl, 2-phenylethyl, or trimethylsilyl. Preferred alkyl groups of one to four carbon atoms are i-butyl, s-butyl, t-butyl, and n-butyl.

$R_2$ is hydrogen or methyl, and preferably methyl.

The polymeric material comprises from about 20 mol % to about 75 mol %, preferably from about 35 mol % to about 60 mol %, of recurring units derived from N-phenylmaleimide, N-cyclohexylmaleimide, N-benzylmaleimide, or a mixture thereof. N-Phenylmaleimide is a preferred monomer.

The underlayer may additionally comprise a resin or resins having activated methylol and/or activated alkylated methylol groups. Such resins include, for example: resole resins and their alkylated analogs; methylol melamine resins and their alkylated analogs, for example melamine-formaldehyde resins; methylol glycoluril resins and alkylated analogs, for example, glycoluril-formaldehyde resins; thiourea-formaldehyde resins; guanamine-formaldehyde resins; and benzoguanamine-formaldehyde resins. Commercially available melamine-formaldehyde resins and glycoluril-formaldehyde resins include, for example, CYMEL® resins (Dyno Cyanamid Co., Ltd.) and NIKALAC® resins (Sanwa Chemical Co., Ltd.).

The resin or resins having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

Additionally, the underlayer may comprise a first added copolymer. The first added copolymer comprises, in polymerized form, from about 1 to about 30 wt %, preferably from about 3 to about 20 wt %, more preferably from about 5 wt % of recurring units derived from N-phenylmaleimide; from about 1 to about 30 wt %, preferably from about 5 to about 20 wt %, more preferably from about 10 wt % of recurring units derived from methacrylamide; from about 20 to about 75 wt %, preferably from about 35 to about 60 wt % of recurring units derived from acrylonitrile; and from about 20 to about 75 wt %, preferably from about 35 to about 60 wt % of recurring units derived from:

$$CH_2{=}C{-}(R_4){-}CO_2{-}CH_2CH_2{-}NH{-}CO{-}NH\text{-}p\text{-}C_6H_4{-}R_3$$

in which $R_3$ is OH, COOH, or $SO_2NH2$; and $R_4$ is hydrogen or methyl;

and, optionally, from about 1 to about 30 wt %, preferably, when present, about from 3 to about 20 wt % of recurring units derived from:

$$CH_2{=}C(R_6){-}CO{-}NH\text{-}p\text{-}C_6H_4{-}R_5$$

in which $R_5$ is OH, COOH, or $SO_2NH_2$; and $R_6$ is hydrogen or methyl.

Additionally, the underlayer may also comprise a second added copolymer. The second added copolymer comprises, in polymerized form, recurring units derived from N-phenylmaleimide, methacrylamide, and (meth)acrylic acid (that is, acrylic acid or methacrylic acid). These copolymers comprise from about 25 to about 75 mol %, preferably from about 35 to about 60 mol % of recurring units derived from N-phenylmaleimide; from about 10 to about 50 mol %, preferably from about 15 to about 40 mol % of methacrylamide; and from about 5 to about 30 mol %, preferably from about 10 to about 30 mol %, of recurring units derived from (meth)acrylic acid. These copolymers are disclosed in U.S. Pat. No. 6,294,311 (Shimazu et al.) and U.S. Pat. No. 6,528,228 (Savariar-Hauck et al.), the disclosures of which are incorporated herein by reference.

The polymeric materials and the added copolymers can be prepared by methods, such as free radical polymerization, which are well known to those skilled in the art and which are described, for example, in Chapters 20 and 21, of *Macromolecules*, Vol. 2, 2nd Ed., H. G. Elias, Plenum, N.Y., 1984. Useful free radical initiators are peroxides such as benzoyl peroxide (BPO), hydroperoxides such as cumyl hydroperoxide and azo compounds such as 2,2'-azobis (isobutyronitrile) (AIBN). Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

When a photothermal conversion material is present, it typically comprises from about 0.1 wt % to about 25 wt %, preferably from about 5 wt % to about 20 wt %, more preferably from about 10 wt % to 15 wt %, of the underlayer, based on the total weight of the underlayer. When a surfactant is present in the underlayer, it typically comprises from about 0.05 wt % to about 1 wt %, preferably from about 0.1 wt % to about 0.6 wt %, more preferably from about 0.2 wt % to 0.5 wt %, based on the total weight of the underlayer. The resole resin typically comprises from about 7 wt % to about 15 wt %, preferably from about 8 wt % to about 12 wt %, more preferably about 10 wt % of the underlayer, based on the total weight of the underlayer.

When the underlayer does not comprise either the resin having activated methylol or activated alkylated methylol groups, the first added copolymer, or the second added copolymer, the underlayer typically comprises from about 5 wt % to about 20 wt % of the photothermal conversion material and from about 80 wt % to about 95 wt % the polymeric material. When the photothermal conversion material is not present, the underlayer typically comprises from about 95 wt % to 100 wt % of the polymeric material.

When the underlayer does not comprise either the first or second added copolymers, the underlayer typically comprises the resole resin, the photothermal conversion material, optionally the surfactant, and from about 60 wt % to about 90 wt %, preferably from about 65 wt % to about 80 wt %, of the polymeric material. When the photothermal conversion material is not present, the underlayer typically comprises the resole resin, optionally the surfactant, and from about 85 wt % to about 93 wt %, preferably from about 88 wt % to about 92 wt % of the polymeric material.

When the first added copolymer is present, the underlayer typically comprises the resole resin, the photothermal conversion material, optionally the surfactant, from about 40 wt % to about 80 wt %, preferably from about 50 wt % to about 70 wt %, of the polymeric material, and from about 5 wt % to about 25 wt %, preferably from about 10 wt % to about 20 wt %, of the first added copolymer. When the photothermal conversion material is not present, the underlayer typically comprises the resole resin, optionally the surfactant, and from about 60 wt % to 85 wt %, preferably from about 65 wt % to about 80 wt % of the polymeric material, and from about 5 wt % to about 30 wt %, preferably from about 10 wt % to about 25 wt %, of the first added copolymer.

When the first added copolymer and the second added copolymer are present, the underlayer typically comprises the resole resin, the photothermal conversion material, optionally the surfactant, from about 15 wt % to about 45 wt %, preferably from about 20 wt % to about 40 wt %, of the polymeric material, from about 5 wt % to about 25 wt %, preferably from about 10 wt % to about 20 wt %, of the first added copolymer, and from about 15 wt % to about 45 wt %, preferably from about 20 wt % to about 40 wt %, of the second added copolymer. When the photothermal conversion material is not present, the underlayer typically comprises the resole resin, optionally the surfactant, and from about 15 wt % to about 50 wt %, preferably from about 20 wt % to about 45 wt % of the polymeric material, from about 5 wt % to about 30 wt %, preferably from about 10 wt % to about 20 wt %, of the first added copolymer, and from about 15 wt % to about 50 wt %, preferably from about 20 wt % to about 45 wt %, of the second added copolymer.

Top Layer

The top layer, sometimes known as the imageable layer, is over the underlayer. The top layer becomes soluble or dispersible in the developer following thermal exposure. It typically comprises an ink-receptive polymeric material, known as the binder, and a dissolution inhibitor. Alternatively, or additionally, the polymeric material comprises polar groups and acts as both the binder and dissolution inhibitor.

Any top layer used in multi-layer thermally imageable elements may be used in the imageable elements of the invention. These are described for example in U.S. Pat. No. 6,358,669 (Savariar-Hauck et al.), the disclosure of which is incorporated herein by reference, and U.S. Pat. No. 6,555,291 (Hauck), the disclosure of which is incorporated herein by reference.

Preferably, the binder in the top layer is a light-stable, water-insoluble, developer-soluble, film-forming phenolic resin. Phenolic resins have a multiplicity of phenolic hydroxyl groups, either on the polymer backbone or on pendent groups. Novolac resins, resol resins, acrylic resins that contain pendent phenol groups, and polyvinyl phenol resins are preferred phenolic resins. Novolac resins are more preferred. Novolac resins are commercially available and are well known to those skilled in the art. They are typically prepared by the condensation reaction of a phenol, such as phenol, m-cresol, o-cresol, p-cresol, etc, with an aldehyde, such as formaldehyde, paraformaldehyde, acetaldehyde, etc. or a ketone, such as acetone, in the presence of an acid catalyst. Typical novolac resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolac resins are prepared by reacting m-cresol, mixtures of m-cresol and p-cresol, or phenol with formaldehyde using conventional conditions.

A solvent soluble novolac resin is one that is sufficiently soluble in a coating solvent to produce a coating solution that can be coated to produce a top layer. In some cases, it may be desirable to use a novolac resin with the highest weight average molecular weight that maintains its solubility in common coating solvents, such as acetone, tetrahydrofuran, and 1-methoxypropan-2-ol. Top layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of about 10,000 to at least about 25,000, may be used. Top layers comprising m-cresol/p-cresol novolac resins with at least 10 mol % p-cresol, having a weight average molecular weight of about 8,000 to about 25,000, may also be used. In some instances, novolac resins prepared by solvent condensation may be desirable. Top layers comprising these resins are disclosed in U.S. Ser. No. 10/264,814, filed Oct. 4, 2002, the disclosure of which is incorporated herein by reference.

The top layer typically comprises a dissolution inhibitor, which functions as a solubility-suppressing component for the binder. Dissolution inhibitors have polar functional groups that are believed to act as acceptor sites for hydrogen bonding with the hydroxyl groups present in the binder. The acceptor sites comprise atoms with high electron density, preferably selected from electronegative first row elements, especially carbon, nitrogen, and oxygen. Dissolution inhibitors that are soluble in the developer are preferred.

Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. Compounds containing other polar groups, such as ether, amine, azo, nitro, ferrocenium, sulfoxide, sulfone, and disulfone may also be useful as dissolution inhibitors.

The dissolution inhibitor may be a monomeric and/or polymeric compound that comprises a diazobenzoquinone moiety and/or a diazonaphthoquinone moiety. Other useful dissolution inhibitors are triarylmethane dyes, such as ethyl violet, crystal violet, malachite green, brilliant green, Victoria blue B, Victoria blue R, Victoria blue BO, BASONYL® Violet 610, and D11 (PCAS, Longjumeau, France).

These dyes can also act as contrast dyes, which distinguish the unimaged regions from the imaged regions in the developed imageable element.

When a dissolution inhibitor is present in the top layer, it typically comprises at least about 0.1 wt %, typically from about 0.5 wt % to about 30 wt %, preferably from about 1 wt % to 15 wt %, based on the dry weight of the layer.

Alternatively, or additionally, the polymeric material in the top layer can comprise polar groups that act as acceptor sites for hydrogen bonding with the hydroxy groups present in the polymeric material and, thus, act as both the polymeric material and dissolution inhibitor. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in U.S. Pat. No. 5,705,308 (West et al.) and U.S. Pat. No. 5,705,322 (West et al.).

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which from about 1 mol % to 3 mol %, preferably from about 1.5 mol % to about 2.5 mol %, of the hydroxyl groups have been converted to phenyl sulfonate or p-toluene sulfonate (tosyl) groups.

Photothermal Conversion Material

Imageable elements that are to be imaged with infrared radiation typically comprise an infrared absorber, known as a photothermal conversion material. Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include, for example, dyes and pigments. Suitable pigments include, for example, carbon black, Heliogen Green, Nigrosine Base, iron (III) oxide, manganese oxide, Prussian Blue, and Paris blue. Because of its low cost and wide absorption bands that allow it to be used with imaging devices having a wide range of peak emission wavelengths, one particularly useful pigment is carbon black. The size of the pigment particles should not be more than the thickness of the layer that contains the pigment. Preferably, the size of the particles will be half the thickness of the layer or less.

To prevent sludging of the developer by insoluble material, photothermal conversion materials that are soluble in the developer are preferred. The photothermal conversion material may be a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogeno-pyryloarylidene and bis (chalcogenopyrylo)polymethine, oxyindolizine, pyrazoline azo, and oxazine classes. Absorbing dyes are disclosed in numerous publications, for example, in EP 0,823,327 (Nagasaka); U.S. Pat. No. 4,973,572 (DeBoer); U.S. Pat. No. 5,244,771 (Jandrue); U.S. Pat. No. 5,208,135 (Patel); and U.S. Pat. No. 5,401,618 (Chapman). Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), SpectraIR 830A and SpectraIR 840A (Spectra Colors), as well as IR Dye A, and IR Dye B, whose structures are shown below.

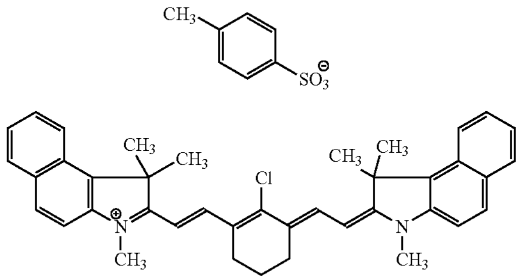

IR Dye A

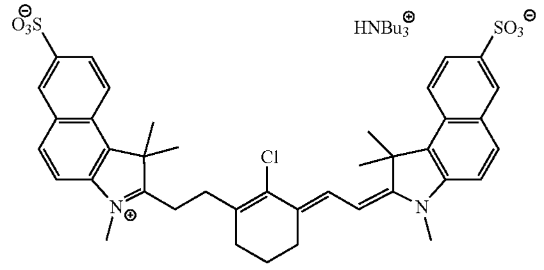

IR Dye B

To prevent ablation during imaging with infrared radiation, the top layer is substantially free of photothermal conversion material. That is, the photothermal conversion material in the top layer, if any, absorbs less than about 10% of the imaging radiation, preferably less than about 3% of the imaging radiation, and the amount of imaging radiation absorbed by the top layer, if any, is not enough to cause ablation of the top layer.

The amount of infrared absorber is generally sufficient to provide an optical density of at least 0.05, and preferably, an optical density of from about 0.5 to at least about 2 to 3 at the imaging wavelength. As is well known to those skilled in the art, the amount of compound required to produce a particular optical density can be determined from the thickness of the underlayer and the extinction coefficient of the infrared absorber at the wavelength used for imaging using Beer's law.

Other Layers

When an absorber layer is present, it is between the top layer and the underlayer. The absorber layer preferably consists essentially of the photothermal conversion material and, optionally, a surfactant. It may be possible to use less of the photothermal conversion material if it is present in a separate absorber layer. The absorber layer preferably has a thickness sufficient to absorb at least 90%, preferably at least 99%, of the imaging radiation. Typically, the absorber layer has a coating weight of from about 0.02 $g/m^2$ to about 2 $g/m^2$, preferably from about 0.05 $g/m^2$ to about 1.5 $g/m^2$. Elements that comprise an absorber layer are disclosed in U.S. Pat. No. 6,593,055 (Shimazu et al.), the disclosure of which is incorporated herein by reference.

To further minimize migration of the infrared absorber from the underlayer to the top layer during manufacture and storage of the imageable element, the element may comprise a barrier layer between the underlayer and the top layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

Preparation of the Imageable Element

The imageable element may be prepared by sequentially applying the underlayer over the hydrophilic surface of the substrate; applying the absorber layer or the barrier layer if present, over the underlayer; and then applying the top layer using conventional techniques.

The terms "solvent" and "coating solvent" include mixtures of solvents. These terms are used although some or all of the materials may be suspended or dispersed in the solvent rather than in solution. Selection of coating solvents depends on the nature of the components present in the various layers.

The underlayer may be applied by any conventional method, such as coating or lamination. Typically the ingredients are dispersed or dissolved in a suitable coating solvent, and the resulting mixture coated by conventional methods, such as spin coating, bar coating, gravure coating, die coating, or roller coating. The underlayer may be applied, for example, from mixtures of methyl ethyl ketone, 1-methoxypropan-2-ol, butyrolactone, and water; from mixtures of diethyl ketone, water, methyl lactate, and γ-butyrolactone; and from mixtures of diethyl ketone, water, and methyl lactate.

When neither a barrier layer nor an absorber layer is present, the top layer is coated on the underlayer. To prevent the underlayer from dissolving and mixing with the top layer, the top layer should be coated from a solvent in which the underlayer layer is essentially insoluble. Thus, the coating solvent for the top layer should be a solvent in which the components of the top layer are sufficiently soluble that the top layer can be formed and in which any underlying layers are essentially insoluble. Typically, the solvents used to coat the underlying layers are more polar than the solvent used to coat the top layer. The top layer may be applied, for example, from diethyl ketone, or from mixtures of diethyl ketone and 1-methoxy-2-propyl acetate. An intermediate drying step, i.e., drying the underlayer, if present, to remove coating solvent before coating the top layer over it, may also be used to prevent mixing of the layers.

Alternatively, the underlayer, the top layer or both layers may be applied by conventional extrusion coating methods from a melt mixture of layer components. Typically, such a melt mixture contains no volatile organic solvents.

Imaging and Processing

The element may be thermally imaged with a laser or an array of lasers emitting modulated near infrared or infrared radiation in a wavelength region that is absorbed by the imageable element. Infrared radiation, especially infrared radiation in the range of from about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Alternatively, the imageable element may be thermally imaged using a hot body, such as a conventional apparatus containing a thermal printing head. A suitable apparatus includes at least one thermal head but would usually include a thermal head array, such as a TDK Model No. LV5416 used in thermal fax machines and sublimation printers: the GS618-400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged regions and complementary unimaged regions. Development of the imaged element to form a printing plate, or printing form, converts the latent image to an image by removing the imaged regions, revealing the hydrophilic surface of the underlying substrate.

Suitable developers depend on the solubility characteristics of the ingredients present in the imageable element. The developer may be any liquid or solution that can penetrate and remove the imaged regions of the imageable element without substantially affecting the complementary unimaged regions. While not being bound by any theory or explanation, it is believed that image discrimination is based on a kinetic effect. The imaged regions of the top layer are removed more rapidly in the developer than the unimaged regions. Development is carried out for a long enough time to remove the imaged regions of the top layer and the underlying regions of the other layer or layers of the element, but not long enough to remove the unimaged regions of the top layer. Hence, the top layer is described as being "not removable" by, or "insoluble" in, the developer prior to imaging, and the imaged regions are described as being "soluble" in, or "removable" by, the developer because they are removed, i.e. dissolved and/or dispersed, more rapidly in the developer than the unimaged regions. Typically, the underlayer is dissolved in the developer and the top layer is dissolved and/or dispersed in the developer.

High pH developers can be used. High pH developers typically have a pH of at least about 11, more typically at least 12, even more typically from about 12 to about 14. High pH developers also typically comprise at least one alkali metal silicate, such as lithium silicate, sodium silicate, and/or potassium silicate, and are typically substantially free of organic solvents. The alkalinity can be provided by using a hydroxide or an alkali metal silicate, or a mixture thereof. Preferred hydroxides are ammonium, sodium, lithium and, especially, potassium hydroxides. The alkali metal silicate has a $SiO_2$ to $M_2O$ weight ratio of at least 0.3 (where M is the alkali metal), preferably this ratio is from about 0.3 to about 1.2, more preferably from about 0.6 to about 1.1, most preferably from about 0.7 to about 1.0. The amount of alkali metal silicate in the developer is at least 20 g $SiO_2$ per 100 g of composition and preferably from about 20 to about 80 g, most preferably it is from about 40 to about 65 g. High pH developers can be used in an immersion processor. Typical high pH developers include PC9000, PC3000, Goldstar™, Greenstar™, ThermalPro™, PROTHERM®, MX 1813, and MX1710, aqueous alkaline developers, all available from Kodak Polychrome Graphics LLC. Another useful developer contains 200 parts of Goldstar™ developer, 4 parts of polyethylene glycol (PEG) 1449, 1 part of sodium metasilicate pentahydrate, and 0.5 part of TRITON® H-22 surfactant (phosphate ester surfactant).

Alternatively, the imaged imageable elements can be developed using a solvent based developer in an immersion processor or a spray on processor. Typical commercially available solvent-based developers include 956 Developer, 955 Developer and SP200 (Kodak Polychrome Graphics, Norwalk, Conn., USA). Commercially available spray on processors include the 85 NS (Kodak Polychrome Graphics). Commercially available immersion processors include the Mercury™ Mark V processor (Kodak Polychrome Graphics); the Global Graphics Titanium processor (Global Graphics, Trenton, N.J., USA); and the Glunz and Jensen Quartz 85 processor (Glunz and Jensen, Elkwood, Va., USA).

Following development, the resulting printing plate is rinsed with water and dried. Drying may be conveniently carried out by infrared radiators or with hot air. After drying, the printing plate may be treated with a gumming solution comprising one or more water-soluble polymers, for example polyvinylalcohol, polymethacrylic acid, polymethacrylamide, polyhydroxyethylmethacrylate, polyvinylmethylether, gelatin, and polysaccharide such as dextrine, pullulan, cellulose, gum arabic, and alginic acid. A preferred material is gum arabic.

The developed and gummed plate is baked to increase the press run length of the plate. Baking can be carried out, for example, at from about 220° C. to about 260° C. for from about 5 minutes to about 15 minutes, or at a temperature of from about 110° C. to about 130° C., for from about 25 to about 35 min.

INDUSTRIAL APPLICABILITY

The imageable elements of the invention are a multi-layer, positive working, thermally imageable, bakeable lithographic printing precursors that produce lithographic printing plates that have a long press run length and are resistant to press chemistries. They are especially useful for use with ultraviolet curable inks, in which aggressive washes that contain organic solvents (UV wash) are used. Once a lithographic printing plate precursor has been imaged and developed to form a lithographic printing plate, printing can then be carried out by applying a fountain solution and then lithographic ink to the image on its surface. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving material (such as cloth, paper, metal, glass or plastic) either directly or indirectly using an offset printing blanket to provide a desired impression of the image thereon.

EXAMPLES

In the following Examples, "coating solution" refers to the mixture of solvent or solvents and additives coated, even though some of the additives may be in suspension rather than in solution, and "total solids" refers to the total amount of nonvolatile material in the coating solution even though some of the additives may be nonvolatile liquids at ambient temperature. Except where indicated, the indicated percentages are percentages by weight based on the total solids in the coating solution.

These examples are representative of the invention and are not meant to limit the invention in any manner. The following materials are used in the examples.

956 Developer Solvent based (phenoxyethanol) alkaline negative developer (Kodak Polychrome Graphics, Norwalk, Conn., USA)

BC 2-Butoxyethanol (BUTYL CELLOSOLVE®)

BYK-307 Polyethoxylated dimethylpolysiloxane copolymer (BYK Chemie, Wallingford, Conn., USA CREO® Trendsetter 3230 Commercially available platesetter, using Procom Plus software and operating at a wavelength of 830 nm (Creo Products, Burnaby, BC, Canada)

Copolymer 1 Copolymer containing 5 wt % of recurring units derived from N-phenylmaleimide, 10 wt % of recurring units derived from methacrylamide, 45 wt % of recurring units derived from acrylonitrile; and 40 wt % of recurring units derived from: $CH_2C(CH_3)CO_2CH_2CH_2$—NH—CO—NH-p-$C_6H_4$—OH Copolymer 2 Copolymer containing 5 wt % of recurring units derived from N-phenylmaleimide, 10 wt % or recurring units derived from methacrylamide, 6 wt % of recurring units derived from benzoic acid methacrylamide, 48 wt % of recurring units derived from acrylonitrile, and 31 wt % or recurring units derived from: $CH_2C(CH_3)CO_2CH_2CH_2$—NH—CO—NH-p-$C_6H_4$—OH DAA Diacetone alcohol Deletion Fluid 243 Deletion fluid (Kodak Polychrome Graphics, Norwalk, Conn., USA)

ELECTRA EXCEL® Thermally sensitive, positive working, single layer, conditioned, inhibited novolac-containing plate printing plate precursor (Kodak Polychrome Graphics, Norwalk, Conn., USA).

Ethyl violet C.I. 42600; CAS 2390-59-2 ($\lambda_{max}$=596 nm) $[(p-(CH_3CH_2)_2NC_6H_4)_3C^+Cl^-]$ (Aldrich, Milwaukee, Wis., USA)

GOLDSTAR™ Developer Sodium metasilicate based aqueous alkaline developer (Kodak Polychrome Graphics, Norwalk, Conn., USA)

IR Dye A Infrared absorbing dye ($\lambda_{max}$=830 nm) (Eastman Kodak, Rochester, N.Y., USA) (see structure above)

N-13 Novolac resin; 100% m-cresol; MW 13,000 (Eastman Kodak Rochester, N.Y., USA)

PM DOWANOL® PM (propylene glycol methyl ether; 1-methoxy-2-propanol) (Dow, Midland, Mich., USA)

Resole resin GP649D99 (Georgia-Pacific, Atlanta, Ga., USA)

Substrate A 0.3 gauge, aluminum sheet which had been electrograined, anodized and treated with a solution of sodium dihydrogen phosphate/sodium fluoride Substrate B Aluminum sheet that had been electrochemically grained, anodized, and coated with polyvinyl phosphonic acid Example 1

This preparative example illustrates preparation of a copolymer comprising from 41.5 mol % of recurring units derived from N-phenylmaleimide, 21 mol % of recurring units derived from methacrylic acid, and 37.5 mol % of recurring units derived from N-(iso-butoxymethyl)acrylamide.

N-Phenylmaleimide (19.31 g), methacrylic acid (4.86 g), N-(iso-butoxymethyl)acrylamide (15.84 g) (Cytec Industries, Charlotte, N.C., USA), and 50:50 (v:v) dioxolane/ethanol (126.01 g) were placed in a 1 L reaction kettle fitted with a reflux condenser, nitrogen supply, thermometer, stirrer, and heating mantle. Nitrogen was bubbled through the reaction mixture for one hour. The reaction was heated to 60° C. under nitrogen and 2,2-azobisisobutyronitrile (AIBN) (0.054 g in 10 g of dioxolane/ethanol) was added. The reaction mixture was stirred under nitrogen at 60° C. for about 20 hours. The reaction mixture was slowly added to water (about 1 L), and the resulting precipitate filtered. The precipitate was washed with about 1 L of 80:20 ethanol/water, filtered again, and dried for two days at 50° C. Yield: 79%

Example 2

This preparative example illustrates preparation of a copolymer containing 41.5 mol % or recurring units derived from N-phenylmaleimide, 21 mol % or recurring units derived from methacrylic acid, 19 mol % or recurring units derived from methacryamide, and 18.5 mol % or recurring units derived from N-(iso-butoxymethyl)acrylamide. The procedure of Example 1 was repeated except that N-phenylmaleimide (21.26 g), methacrylic acid (5.35 g), methacrylamide (4.78 g), N-(iso-butoxymethyl)acrylamide (8.60 g) and 50:50 (v:v) dioxolane/ethanol (126.01 g) were used to prepare the copolymer. Yield: 75%.

Example 3

This preparation example illustrates preparation of a copolymer containing 41.5 mol % of recurring units derived from N-phenylmaleimide, 21 mol % of recurring units derived from methacrylic acid, 19 mol % or recurring units derived from methacryamide, and 18.5 mol % or recurring units derived from N-(butoxymethyl)acrylamide. The procedure of Example 1 was repeated except that N-phenylmaleimide (21.26 g), methacrylic acid (5.35 g), methacrylamide (4.78 g), N-(butoxymethyl)acrylamide (8.60 g) (Cytec Industries, Charlotte, N.C., USA) and 50:50 (v:v) dioxolane/ethanol (126.01 g) were used to prepare the copolymer. Yield: 72%.

Example 4

This preparative example illustrates preparation of a functionalized novolac resin.

N-13 (24 g, 199.75 millimoles) was added in acetone (66 g) with stirring and the resulting mixture cooled 10° C. in an ice/water bath. p-Toluene sulfonyl chloride (20.02 millimoles) at 10° C. over 1 minute. Triethylamine (19.63 millimoles) was added at 10° C. over 2 min. The reaction mixture was stirred for 10 minutes at less than 15° C. Acetic acid (8.33 millimoles) was added at 10° C. over 10 seconds, and the reaction mixture stirred for 15 minutes. Water/ice (160 g), and acetic acid (1.2 g, 20.02 millimoles) was added over several minutes at 15° C. and the reaction mixture stirred below 15° C. for 5 minutes.

The supernatant was decanted from the tacky solid that formed in the bottom of the reaction flask. Acetone (354 g) was added, and the reaction mixture stirred until a clear solution was obtained. Water/ice (160 g) and acetic acid (1.2 g, 20.02 millimoles) were added over several minutes and the reaction mixture stirred for 5 minutes below 15° C. The supernatant was decanted from the tacky solid. Additional acetone (354 g) was added and the reaction mixture stirred until a clear solution was obtained. 25% of the acetone solution was added to a mixture of ice (460 g), water (460 g) and acetic acid (0.5 g). The resulting mixture was stirred for 20 minutes, the precipitate allowed to settle, and the supernatant decanted. The process was repeated with the rest of the acetone solution. The damp polymer fractions were combined, washed twice with water (460 g), and dried. Yield: 88%.

Comparative Example 1

This example illustrates preparation of a copolymer containing 41.5 mol % of recurring units derived from N-phenylmaleimide, 21 mol % or recurring units derived from methacrylic acid, and 37.5% of recurring units derived from methacrylamide The procedure of Preparative Example 1 was repeated except that N-phenylmaleimide (23.59 g), methacrylic acid (5.93 g), methacrylamide (10.48 g) and dioxolane/ethanol (50:50 (v:v); 126.01 g). After precipitation of the copolymer in water, the copolymer was washed with about 1 L of 80:20 ethanol/water containing about 5 drops of concentrated hydrochloric acid, filtered again, washed with about 1 L of 80:20 ethanol/water, filtered again, and dried for two days at 50° C. Yield: 80%.

Comparative Examples 2 to 4 and Inventive Examples 5 to 10

Comparative Example 2 ($C_2$) is an ELECTRA EXCEL® thermally sensitive, positive working, single layer, conditioned, inhibited novolac-containing plate printing plate precursor. It develops in high pH developer, is bakeable, but has poor resistance to press chemicals. Comparative Examples 3 (C3) and 4 (C4) and Inventive Examples 5 to 10 were prepared by the following procedure.

Underlayer:

Coating solutions containing the components listed in TABLE 1 in methyl ethyl ketone/1-methoxypropan-2-ol/butyrolactone/water (65/15/10/10, w:w:w:w) were coated onto substrate A using a wire wound bar. The resulting element comprising the underlayer and the substrate was dried at 135° C. for 35 sec. The coating weight of each of the resulting underlayers was 1.3 g/$m^2$.

Top Layer:

A coating solution containing 99.35 parts by weight of the functionalized novolac resin prepared in Example 4, 0.3 parts by weight of ethyl violet, and 0.35 parts by weight of BYK-307 in diethyl ketone/1-methoxy-2-propyl acetate (92/8, w:w) was coated onto each underlayer, using a wire wound bar. Each resulting imageable element was dried at 135° C. for 35 seconds. The coating weight of each of the resulting top layers was 0.9 g/$m^2$.

TABLE 1

| Component | Example C3 | C4 | 5 | 6 |
|---|---|---|---|---|
| | Parts by Weight | | | |
| Copolymer of Comparative Example 1 | 59.65 | 74.65 | — | — |
| Copolymer of Example 1 | — | — | 59.65 | 74.65 |
| Copolymer 1 | 15 | — | 15 | — |
| GP649D99 | 10 | 10 | 10 | 10 |
| IR Dye A | 15 | 15 | 15 | 15 |
| BYK-307 | 0.35 | 0.35 | 0.35 | 0.35 |

| Component | Example 7 | 8 | 9 | 10 |
|---|---|---|---|---|
| | Parts by Weight | | | |
| Copolymer of Example 2 | 59.65 | 74.65 | — | — |
| Copolymer of Example 3 | — | — | 59.65 | 74.65 |
| Copolymer 1 | 15 | — | 15 | — |
| GP649D99 | 10 | 10 | 10 | 10 |
| IR Dye A | 15 | 15 | 15 | 15 |
| BYK-307 | 0.35 | 0.35 | 0.35 | 0.35 |

The imageable elements from Comparative Examples 2 to 4 (C2 to C4) and Inventive Examples 5 to 10 were evaluated with the following tests. The results are given in the following TABLE 2.

Developer drop test on underlayer only: A large drop of Goldstar™ developer was placed on the underlayer of each element at 22° C., and the time required to dissolve the layer ("coating") was noted.

Developer drop test on complete imageable element: A large drop of Goldstar™ developer was placed on each imageable element at 22° C. and the time required to dissolve the layers is noted.

Cleanout and Resolution: Each imageable element was imaged with 830 nm radiation with an internal test pattern (plot 0), on a CREO® 3230 Trendsetter at 100 to 180 $mJ/cm^2$, in 20 $mJ/cm^2$ increments (at 9 W). Each imaged imageable element was machine processed with Goldstar™ developer in a Kodak Polychrome Graphics Mercury™ Mark V Processor (750 mm/min processing speed, 23° C. developer temperature). The resulting printing plates were evaluated for cleanout (first imaging exposure where exposed regions dissolve completely in developer) and best resolution (imaging exposure where plate performs best).

Solvent resistance drop test on complete imageable element: A large drop of either diacetone alcohol/water (80:20, v:v) or 2-butoxyethanol/water (80:20, v:v) was placed on each imageable element at 22° C. The time required to dissolve the layers was noted, and the amount of material removed after 1 minute was assessed.

Baking test: Each imageable element was baked at 210° C. and 230° C. for 8 minutes in a Mathis LTE labdryer oven (Werner Mathis, Switzerland) (fan speed of 1000 rpm). After the element was baked, a 6 minute drop test was carried out with methyl lactate/diethyl ketone/butyrolactone/water (45/36/10/9, w:w) a typical coating solvent composition for this type of element, and the amount of material removed was assessed.

Deletion gel test: A Kodak Polychrome Graphics positive deletion gel (contains hydrofluoric acid) was applied to the baked imageable elements for up to 3 min, and the amount of time required for removal of the baked layer ("coating") was noted.

TABLE 2

| Example | Goldstar ™ Developer Drop Test (sec) Under-layer | Complete element | Minimum exposure required for ($mJ/cm^2$) Clean out | Best Resolution |
|---|---|---|---|---|
| C2 | n/a | 50 | 100 | 160 |
| C3 | 8 | 180 | 125 | 135 |
| C4 | 5 | 90 | 120 | 125 |
| 5 | >60 | 300 | 180 | >180 |
| 6 | >60 | 90 | 180 | >180 |
| 7 | 25 | 240 | 155 | 160 |
| 8 | 18 | 150 | 155 | 160 |
| 9 | 25 | 240 | 150 | 160 |
| 10 | 16 | 120 | 150 | 150 |

| Example | Solvent resistance drop test (sec) DAA/water | BC/water | Weight loss after 1 minute (%) DAA/water | BC/water |
|---|---|---|---|---|
| C2 | <10 | <10 | 100 | 100 |
| C3 | >180 | >180 | 25 | 20 |
| C4 | >180 | >180 | 25 | 35 |
| 5 | 20 | 20 | 100 | 100 |
| 6 | 20 | 20 | 100 | 100 |
| 7 | 90 | >180 | 80 | 35 |
| 8 | 60 | 60 | 100 | 100 |
| 9 | 90 | >180 | 80 | 20 |
| 10 | 60 | >180 | 100 | 40 |

| Example | Baked plates at 210° C. 6 Minute drop test | Deletion gel | Baked plates at 230° C. 6 Minute drop test | Deletion gel |
|---|---|---|---|---|
| C2 | A little coating removed | A little coating removed | No coating removed | No coating removed |
| C3 | Most coating removed | Most coating removed | A little coating removed | A little coating removed |
| C4 | All coating removed | All coating removed | All coating removed | All coating removed |
| 5 | No coating removed | No coating removed | No coating removed | No coating removed |
| 6 | No coating removed | No coating removed | No coating removed | No coating removed |
| 7 | No coating removed | No coating removed | No coating removed | No coating removed |
| 8 | A little coating removed | A little coating removed | A little coating removed | A little coating removed |
| 9 | No coating removed | A little coating removed | No coating removed | No coating removed |
| 10 | A little coating removed | A little coating removed | A little coating removed | A little coating removed |

Example 11

This preparative example illustrates preparation of a copolymer having 40 mol % of recurring units derived from N-phenylmaleimide, 25 mol % of recurring units derived from methacrylic acid, 25 mol % or recurring units derived from methacrylamide, and 10 mol % of recurring units derived from N-(Isobutoxymethyl)acrylamide. The procedure of Example 1 was repeated except that N-phenylmaleimide (21.68 g), methacrylic acid (6.74 g), methacrylamide (6.66 g), N-(iso-butoxymethyl)acrylamide (4.92 g) and dioxolane/ethanol (50:50 (v:v); 126.01 g) were used to prepare the copolymer. Yield: 79%

Example 12

This preparative example illustrates preparation of a copolymer having 40 mol % of recurring units derived from N-phenylmaleimide, 25 mol % or recurring units derived from methacrylic acid, 25 mol % or recurring units derived from methacrylamide, and 10 mol % or recurring units derived from N-(butoxymethyl)acrylamide. The procedure of Example 1 was repeated except that N-phenylmaleimide (21.68 g), methacrylic acid (6.74 g), methacrylamide (6.66 g), N-(butoxymethyl)acrylamide (4.92 g), and dioxolane/ethanol (50:50 (v:v); 126.01 g) were used to prepare the copolymer. Yield: 82%.

Example 13

This preparative example illustrates preparation of a copolymer having 30 mol % of recurring units derived from N-phenylmaleimide, 20 mol % of recurring units derived from methacrylic acid, 35 mol % of recurring units derived from methacrylamide, and 15 mol % of recurring units derived from N-(isobutoxymethyl)acrylamide. The procedure of Example 1 was repeated except that N-phenylmaleimide (16.96 g), methacrylic acid (5.62 g), methacrylamide (9.72 g), N-(butoxymethyl)acrylamide (7.70 g), and dioxolane/ethanol (50:50 (v:v); 126.01 g) were used to prepare the copolymer. Yield: 83%.

Examples 14 to 19

Imageable elements were prepared as in Examples 5 to 10, except that the ingredients listed in the following TABLE 3 were used in the underlayer.

TABLE 3

| Component | Example 14 | Example 15 | Example 16 | Example 17 |
|---|---|---|---|---|
| | Parts by Weight | | | |
| Copolymer of Example 11 | 59.65 | 74.65 | — | — |
| Copolymer of Example 12 | — | — | 59.65 | 74.65 |
| Copolymer 2 | 15 | — | 15 | — |
| GP649D99 | 10 | 10 | 10 | 10 |
| IR Dye A | 15 | 15 | 15 | 15 |
| BYK-307 | 0.35 | 0.35 | 0.35 | 0.35 |
| | Example 18 | Example 19 | | |
| | Parts by Weight | | | |
| Copolymer of Example 13 | 59.65 | 74.65 | | |
| Copolymer 2 | 15 | — | | |
| GP649D99 | 10 | 10 | | |
| IR Dye A | 15 | 15 | | |
| BYK-307 | 0.35 | 0.35 | | |

The resulting imageable elements were evaluated as in Examples 5 to 10, except that the 6 minute drop test was not carried out and the baking test was assessed on a 10 point scale in which 1=no removal, and 10=complete removal. The results are given in the following TABLE 4.

TABLE 4

| Example | Goldstar ™ Developer Drop Test (sec): Under-layer | Goldstar ™ Developer Drop Test (sec): Complete Element | Minimum exposure required for (mJ/cm$^2$): Clean Out | Minimum exposure required for (mJ/cm$^2$): Best Resolution |
|---|---|---|---|---|
| 14 | 15 | 180 | <120 | <120 |
| 15 | 5 | 60 | <120 | <120 |
| 16 | 15 | 120 | <120 | <120 |
| 17 | 5 | 80 | <120 | <120 |
| 18 | 30 | 150 | <100 | 100 |
| 19 | 5 | 90 | <100 | 100 |
| Example | Solvent resistance drop test (sec): DAA/water | Solvent resistance drop test (sec): BC/water | Weight loss after 1 minute (%): DAA/water | Weight loss after 1 minute (%): BC/water |
| 14 | 180 | >180 | 30 | 10 |
| 15 | 180 | 180 | 35 | 30 |
| 16 | >180 | >180 | 20 | 5 |
| 17 | 180 | >180 | 30 | 15 |
| 18 | >180 | >180 | 25 | 20 |
| 19 | 180 | 180 | 30 | 40 |
| Example | Baked plates at 210° C.: Deletion gel[a] | | Baked plates at 230° C.: Deletion gel[a] | |
| 14 | 3 | | 1 | |
| 15 | 5 | | 3 | |
| 16 | 3 | | 2 | |
| 17 | 5 | | 3 | |
| 18 | 1 | | 1 | |
| 19 | 4 | | 1 | |

[a]1 = no removal; 10 = complete removal

Comparative Example 5

This comparative example illustrates preparation of a copolymer containing 40 mol % of recurring units derived from N-phenylmaleimide, 25 mol % of recurring units derived from methacrylic acid, and 35 mol % or recurring units derived from methacrylamide.

To a 1:1 mixture of dioxolane/methanol (250 ml) in a 500 ml 3-necked round-bottomed flask equipped with a stirrer, thermometer, nitrogen inlet and reflux condenser was added a 250 ml of a mixture of methacrylic acid (21.52 g), N-phenylmaleimide (69.27 g), and methacrylamide (29.79 g). After the monomers dissolved with stirring, AIBN (1.50 g) was added and the reaction mixture heated at 60° C. with stirring for 22 hours. The resulting polymer was by precipitated in 2000 ml of water, filtered, and dried in the oven at 40° C. for 2 days.

Example 20

This example illustrates preparation of a polymeric material containing 35 mol % of recurring units derived from N-phenylmaleimide, 20 mol % of recurring units derived from methacrylic acid, 20 mol % or recurring units derived from methacrylamide, and 25 mol % of recurring units derived from N-methoxymethylmethacrylamide. The procedure of Comparative Example 5 was repeated except that 250 ml of a mixture of methacrylic acid (17.22 g), N-phenylmaleimide (60.61 g), methacrylamide (17.02 g) and N-methoxymethymethacrylamide (32.25 g) and 1.65 g of AIBN was used.

Comparative Example 6 and Example 21

These examples show evaluation of the copolymers formed in Comparative Example 5 and the polymeric material formed in Example 20 in the underlayer of an imageable element.

The copolymer formed in Comparative Example 5 (2.12 g) and IR Dye A (0.38 g) were dissolved in 30 g of a mixture of 2-butanol (65%), PM (15%), γ-butyrolatone (10%), and water (10%), coated onto a Substrate B, and dried to give an underlayer with a coating weight of 1.40 $g/m^2$. 10 g of a 15 mol % tosylated novolac resin (Diversitec, Fort Collins, Colo., USA) and 0.025 g of ethyl violet were dissolved in 50 g of a mixture of diethyl ketone/1-methoxy-2-propyl acetate (90:10 w %), coated on top of the underlayer, and dried at 92° C. for 90 seconds. The coating weight of the top layer was 0.80 $g/m^2$. The imageable element was imaged in a CREO® Trendsetter with 9.5 W and 225 rpm. The resulting imaged imageable element was developed in GOLDSTAR™ DC developer to form a lithographic printing plate. The image areas had good resistance to the developer. The plate showed good developability in the imaged areas, giving a clean background and good resolution. An additional imaged imageable element was developed in 956 Developer. The resulting printing plate showed a clean background and good resolution.

The procedure was repeated except that the polymeric material prepared in Example 20 was used in the underlayer. The coating weight of the underlayer was 1.51 $g/m^2$, and the coating weight of the top layer was 0.80 $g/m^2$. The imaged imageable element developed with GOLDSTAR™ DC Developer had good resistance to the developer. The element showed good developability in the imaged areas, giving a clean background and good resolution. The imaged imageable element developed with 956 Developer showed a clean background and good resolution.

The copolymer formed in Comparative Example 5 and the polymeric material formed in Example 20 were each coated onto Substrate B as described above to form an element consisting of the underlayer on the substrate. The underlayers were evaluated as follows.

To determine the solvent resistance of the underlayer, each element consisting of the underlayer on the substrate was soaked in BC/water (80/20) for 5 min and the weight loss determined. The soak losses were: 30% for the element containing the copolymer formed in Comparative Example 5, and 21% for the element containing the polymeric material formed in Example 20. Under the same conditions, the single layer of an ELECTRA EXCEL® printing plate precursor was completely removed (100% soak loss).

Bakeability of the underlayer was determined by baking the elements consisting of the underlayer on the substrate at 235° C. for 8 minutes and applying Deletion Fluid 243 to the surface of the underlayer. The underlayer consisting of the copolymer formed in Comparative Example 5 deleted completely within 1 minute. The underlayer consisting of the polymeric material formed in Example 20 showed no deletion after 8 minutes.

The invention has been described in detail with particular reference to preferred embodiments thereof, but it will be understood that variations and modifications can be effected within the spirit and scope of the invention.

We claim:

1. An imageable element comprising:

a substrate;

an underlayer over the substrate; and a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the underlayer is removable by the alkaline developer, and the underlayer comprises a polymeric material that comprises, in polymerized form:

from about 5 mol % to about 30 mol % of recurring units derived from an ethylenically unsaturated polymerizable monomer comprising a carboxy group, from about 20 mol % to about 75 mol % of recurring units derived from N-phenylmaleimide, N-cyclohexylmaleimide, N-benzylmaleimide, or a mixture thereof, from about 3 mol % to about 50 mol % of recurring units derived from a compound (a), represented by the formula:

$$CH_2{=}C(R_2){-}C(O){-}NH{-}CH_2{-}OR_1,$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is hydrogen or methyl, and optionally from about 5 mol % to about 50 mol % of recurring units derived from methacrylamide.

2. The element of claim 1 in which $R_1$ is $C_1$ to $C_4$ alkyl, phenyl, benzyl, 2-phenylethyl, or $Si(CH_3)_3$; and $R_2$ is methyl.

3. The element of claim 1 in which the polymeric material comprises from about 10 mol % to about 30 mol % of recurring units derived from (meth)acrylic acid; from about 35 mol % to about 60 mol % of recurring units derived from N-phenylmaleimide; and from about 10 mol % to about 40 mol % of recurring units derived from compound (a).

4. The element of claim 1 in which the polymeric material additionally comprises from about 15 mol % to about 40 mol % of recurring units derived from methacrylamide.

5. The element of claim 1 in which the underlayer comprises from about 0.1 wt % to about 25 wt % of the photothermal conversion material and from about 80 wt % to about 95 wt % of the polymeric material.

6. The element of claim 1 in which:

the underlayer additionally comprises a first added copolymer, and the first added copolymer comprises from about 1 wt % to about 30 wt % of recurring units derived from N-phenylmaleimide; from about 1 wt % to about 30 wt % of recurring units derived from methacrylamide; from about 20 wt % to about 75 wt % of recurring units derived from acrylonitrile; and from about 20 wt % to about 75 wt % of recurring units derived from compound (b), represented by the formula:

$$CH_2{=}C(R_4){-}CO_2{-}CH_2CH_2{-}NH{-}CO{-}NH\text{-p-}C_6H_4{-}R_3,$$

in which $R_3$ is OH, COOH, or $SO_2NH_2$; and $R_4$ is hydrogen or methyl.

7. The element of claim 6 in which the first added copolymer additionally comprises from about 1 wt % to about 30 wt % of compound (c) represented by the formula:

$$CH_2{=}C(R_6){-}CO{-}NH\text{-p-}C_6H_4{-}R_5$$

in which $R_5$ is OH, COOH, or $SO_2NH_2$; and $R_6$ is hydrogen or methyl.

8. The element of claim 1 in which the top layer comprises a novolac resin and a dissolution inhibitor.

9. The element of claim 7 in which the underlayer additionally comprises a second added copolymer, and the second added copolymer comprises from about 25 mol % to about 75 mol % of recurring units derived from N-phenylmaleimide; from about 10 mol % to about 50 mol % of recurring units derived from methacrylamide; and from about 5 mol % to about 30 mol % of recurring units derived from (meth)acrylic acid.

10. A method for forming an image, the method comprising the steps of:

A) thermally imaging a multi-layer imageable element and forming an imaged imageable element comprising imaged and complementary unimaged regions, wherein said imageable element comprises:

a substrate;

an underlayer over the substrate; and a top layer over the underlayer;

in which:

the element comprises a photothermal conversion material;

the top layer is substantially free of the photothermal conversion material;

the top layer is ink receptive;

before thermal imaging, the top layer is not removable by an alkaline developer;

after thermal imaging to form imaged regions in the top layer, the imaged regions are removable by the alkaline developer;

the underlayer is removable by the alkaline developer, and the underlayer comprises a polymeric material that comprises, in polymerized form:

from about 5 mol % to about 30 mol % of recurring units derived from an ethylenically unsaturated polymerizable monomer having a carboxy group;

from about 20 mol % to about 75 mol % of recurring units derived from N-phenylmaleimide, N-cyclohexylmaleimide, N-benzylmaleimide, or a mixture thereof;

from about 3 mol % to about 50 mol % of recurring units derived from a compound represented by the formula:

$$CH_2{=}C(R_2){-}C(O){-}NH{-}CH_2{-}OR_1,$$

in which $R_1$ is $C_1$ to $C_{12}$ alkyl, phenyl, $C_1$ to $C_{12}$ substituted phenyl, $C_1$ to $C_{12}$ aralkyl, or $Si(CH_3)_3$; and $R_2$ is hydrogen or methyl, and optionally from about 5 mol % to about 50 mol % of recurring units derived from methacrylamide, B) developing the imaged imageable element with the alkaline developer and removing the imaged regions without substantially affecting the unimaged regions.

11. The method of claim 10 additionally comprising the step of baking the imaged imageable element after step B).

12. The method of claim 10 in which the underlayer comprises about 0.1 wt % to about 25 wt % of the photothermal conversion material and from about 80 wt % to about 95 wt % of the polymeric material.

13. An image formed by the method of claim 10.

* * * * *